United States Patent
Thomsen

(10) Patent No.: US 7,821,290 B2
(45) Date of Patent: Oct. 26, 2010

(54) DIFFERENTIAL VOLTAGE MODE DRIVER AND DIGITAL IMPEDANCE CALIBERATION OF SAME

(75) Inventor: Bo Bøgeskov Thomsen, Virum (DK)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 12/239,418

(22) Filed: Sep. 26, 2008

(65) Prior Publication Data
US 2010/0079167 A1 Apr. 1, 2010

(51) Int. Cl.
H03K 17/16 (2006.01)
H03K 19/003 (2006.01)
(52) U.S. Cl. .............................. 326/30; 326/83; 326/86
(58) Field of Classification Search .................... 326/30, 326/80–87, 62, 63, 68; 327/333
See application file for complete search history.

(56) References Cited

U.S. PATENT DOCUMENTS

| | | | |
|---|---|---|---|
| 5,095,229 A | | 3/1992 | Yun et al. |
| 5,661,411 A | | 8/1997 | Nguyen |
| 6,043,699 A | * | 3/2000 | Shimizu ..................... 327/333 |
| 6,066,985 A | | 5/2000 | Xu |
| 6,087,847 A | * | 7/2000 | Mooney et al. ............... 326/30 |
| 6,462,590 B2 | | 10/2002 | Warwar |
| 6,603,348 B1 | | 8/2003 | Preuss et al. |
| 6,633,191 B2 | | 10/2003 | Hu |
| 6,766,395 B1 | | 7/2004 | Tinsley et al. |
| 6,867,618 B2 | | 3/2005 | Li et al. |
| 6,960,946 B2 | | 11/2005 | Messina et al. |
| 7,129,738 B2 | * | 10/2006 | Lin et al. ..................... 326/30 |
| 7,279,937 B2 | | 10/2007 | Aliahmad et al. |
| 7,459,930 B2 | * | 12/2008 | Mei ............................. 326/30 |
| 7,573,288 B2 | * | 8/2009 | Ayyapureddi et al. ......... 326/30 |

OTHER PUBLICATIONS

Wong et al. "A 27-mW 3.6-Gb/s I/O Transceiver" IEEE Journal of Solid-State Circuits, vol. 39, No. 4, Apr. 2004.

* cited by examiner

*Primary Examiner*—Vibol Tan
*Assistant Examiner*—Crystal L Hammond
(74) *Attorney, Agent, or Firm*—Klein, O'Neill & Singh, LLP

(57) ABSTRACT

A differential voltage mode driver and digital impedance calibration of same is provided. In one embodiment, the invention relates to a method of calibrating a differential driver circuit having a plurality of parallel driver stages, the differential driver circuit for driving a differential signal over a transmission line having an impedance, the method including determining an indication of an impedance of a plurality of parallel replica stages, wherein the plurality of parallel replica stages are replicas of the plurality of parallel driver stages, determining a number of the plurality of parallel replica stages to approximately match the measured impedance with the transmission line impedance, and activating a number of the plurality of parallel driver stages equal to the number of the plurality of parallel replica stages. In another embodiment, the invention relates to a differential voltage mode driver using at least one H-bridge driver stage.

15 Claims, 5 Drawing Sheets

US 7,821,290 B2

DIFFERENTIAL VOLTAGE MODE DRIVER AND DIGITAL IMPEDANCE CALIBERATION OF SAME

BACKGROUND OF THE INVENTION

The present invention relates generally to differential drivers, and more particularly to a differential voltage mode driver.

Differential drivers are used in many data communications applications. Many of these applications demand high data transfer rates, including for example, video, integrated circuit (IC), and Ethernet applications. For integrated circuits, differential drivers often provide communications between circuits on an IC chip and between the IC chip and a circuit board. In Ethernet applications, differential drivers can be used for high speed communication applications such as 10 gigabit Ethernet or other Ethernet standards. In one implementation of 10 gigabit Ethernet, sometimes referred to as CX4 or IEEE 802.3ak, data is transmitted bi-directionally over four data lanes using copper cabling. Each data lane can be responsible for 3.125 gigabaud of data transport.

Differential drivers operated at high speeds may face varied circumstances. In many cases, it may be difficult for differential drivers to drive outputs at high speed. In addition, in systems capable of high speed operation, differential drivers may need to support a wide range of low amplitude swings and high amplitude swings. Further, differential drivers can have difficulty in operating with reduced power consumption at high speed. For example, differential drivers often need to be efficient when driving both low and high amplitude swings to minimize power consumption. Such difficulty can be magnified if accounting for impedance matching. Further, operation of the differential driver may change or vary due to process, voltage, and temperature variations.

SUMMARY OF THE INVENTION

The invention variously provides a differential voltage made driver and digital impedance calibration circuitry. In one aspect the invention provides a differential driver circuit having at least one driver stage comprising: an input coupled by a pre-driver to: a gate of a first PMOS transistor in parallel with a first NMOS transistor, where a source of the first PMOS transistor is coupled to a drain of the first NMOS transistor, and a drain of the first PMOS transistor is coupled to a source of the first NMOS transistor; a gate of a second NMOS transistor having a drain coupled to the drain of the first PMOS transistor and a source coupled to a ground; and a gate of a third NMOS transistor; a first differential output coupled to the drain of the second NMOS transistor; the input coupled by an inverting pre-driver to: a gate of a second PMOS transistor in parallel with the third NMOS transistor, where a source of the second PMOS transistor is coupled to a drain of the third NMOS transistor, and a drain of the second PMOS transistor is coupled to a source of the third NMOS transistor; a gate of the first NMOS transistor; and a gate of a fourth NMOS transistor having a drain coupled to the drain of the second PMOS transistor and a source coupled to the ground; and a second differential output coupled to the drain of the fourth NMOS transistor; wherein the source of the first PMOS transistor is coupled to a voltage source; wherein the source of the second PMOS transistor is coupled to the voltage source; and wherein the voltage source is configured to provide a voltage signal indicative of a predetermined peak to peak output voltage.

In another aspect of the invention provides a method of calibrating a differential driver circuit having a plurality of parallel driver stages, the differential driver circuit for driving a differential signal over a transmission line having an impedance, the method comprising: determining an indication of an impedance of a plurality of parallel replica stages, wherein the plurality of parallel replica stages are replicas of the plurality of parallel driver stages; determining a number of the plurality of parallel replica stages to approximately match the determined indication of impedance with the transmission line impedance; and activating a number of the plurality of parallel driver stages equal to the number of the plurality of parallel replica stages.

In another aspect the invention provides a circuit for calibrating a differential driver circuit configured to drive a differential signal over a transmission line having an impedance, the circuit comprising: the differential driver circuit comprising an H-bridge circuit having a plurality of parallel driver stages coupled to driver logic circuitry; a calibration circuit comprising: a plurality of parallel replica stages having an impedance, wherein the plurality of parallel replica stages are replicas of the plurality of parallel driver stages; a resistor coupled with the plurality of parallel replica stages at a node; a comparator configured to generate a signal indicative of a comparison of a voltage at the node with a reference voltage; and calibration logic circuitry coupled to the comparator and to the plurality of parallel replica stages, the calibration logic circuitry configured to determine, based on the comparison signal, a number of the plurality of parallel replica stages to approximately match the impedance of the plurality of the parallel replica stages and the transmission line impedance; and wherein the driver logic circuitry is configured to activate a number of the plurality of parallel driver stages is equal to the number of the plurality of parallel replica stages determined by the calibration logic circuitry.

In other aspect the invention provides a circuit for calibrating a differential driver circuit configured to drive a differential signal over a transmission line having an impedance, the circuit comprising: the differential driver circuit comprising an H-bridge circuit comprising: a plurality of parallel n-type driver stages coupled to a driver logic circuitry; and a plurality of parallel p-type driver stages coupled to the driver logic circuitry; an n-type calibration circuit comprising: a plurality of parallel n-type replica stages having an impedance, wherein the plurality of parallel n-type replica stages are replicas of the plurality of parallel n-type driver stages; a first resistor coupled with the plurality of parallel n-type replica stages at a first node; a first comparator configured to generate a first signal indicative of a comparison of a voltage at the first node with a first reference voltage; and first logic circuitry coupled to the first comparator and to the plurality of parallel n-type replica stages, the first calibration logic circuitry configured to determine, based on the first comparison signal, a first number (N) of the plurality of parallel n-type replica stages to approximately match the impedance of the plurality of the parallel n-type replica stages and the transmission line impedance; and wherein the driver logic circuitry is configured to activate N of the plurality of parallel n-type driver stages; a p-type calibration circuit comprising: a plurality of parallel p-type replica stages having an impedance, wherein the plurality of parallel p-type replica stages are replicas of the plurality of parallel p-type driver stages; a second resistor coupled with the plurality of parallel p-type replica stages at a second node; a second comparator configured to generate a second signal indicative of a comparison of a voltage at the second node with a second reference voltage; and second logic circuitry coupled to the second comparator and to the plurality of parallel p-type replica stages, the second calibration logic circuitry configured to determine, based on the second comparison signal, a second number (P) of the plurality of parallel p-type replica stages to approximately match the impedance of the plurality of the parallel p-type replica stages and the transmission line impedance; and wherein the driver logic circuitry is configured to activate P of the plurality of parallel p-type driver stages.

These and other aspects of the invention are fully comprehended upon review of this disclosure

DETAILED DESCRIPTION

Figure 1:
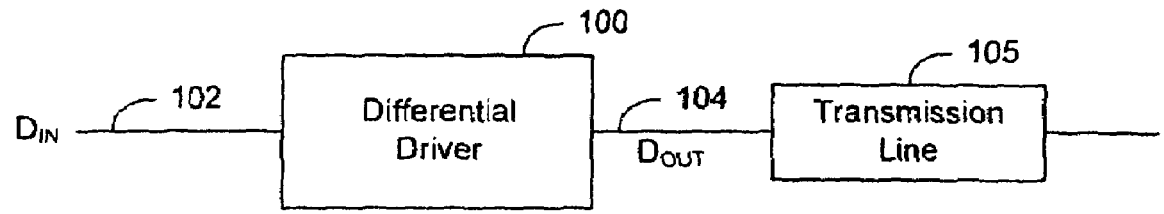
FIG. 1 is a block diagram of a differential driver circuit in accordance with aspects of the invention.

FIG. 1 is a block diagram of a differential driver circuit in accordance with aspects of the invention. The differential driver 100 receives a data input signal ($D_{IN}$) 102 and drives a data output signal ($D_{OUT}$) 104 on a transmission line 105. The data input signal can be single ended or differential, while the data output signal is generally differential. In some embodiments, the differential driver can be used to transfer data in accordance with one or more IEEE Ethernet specifications. For example, in one embodiment, the differential driver can be used to transmit data in accordance with a 10 gigabit Ethernet specification. In other embodiments, the differential driver can be used for other data communications applications. In a number of embodiments, the differential driver is implemented using an integrated circuit including a plurality of metal oxide semiconductor field effect transistors (MOSFETs). The MOSFETs generally include either n-type (NMOS) or p-type (PMOS) transistors based on the type of semiconductor material used to form the MOSFET.

Figure 2:
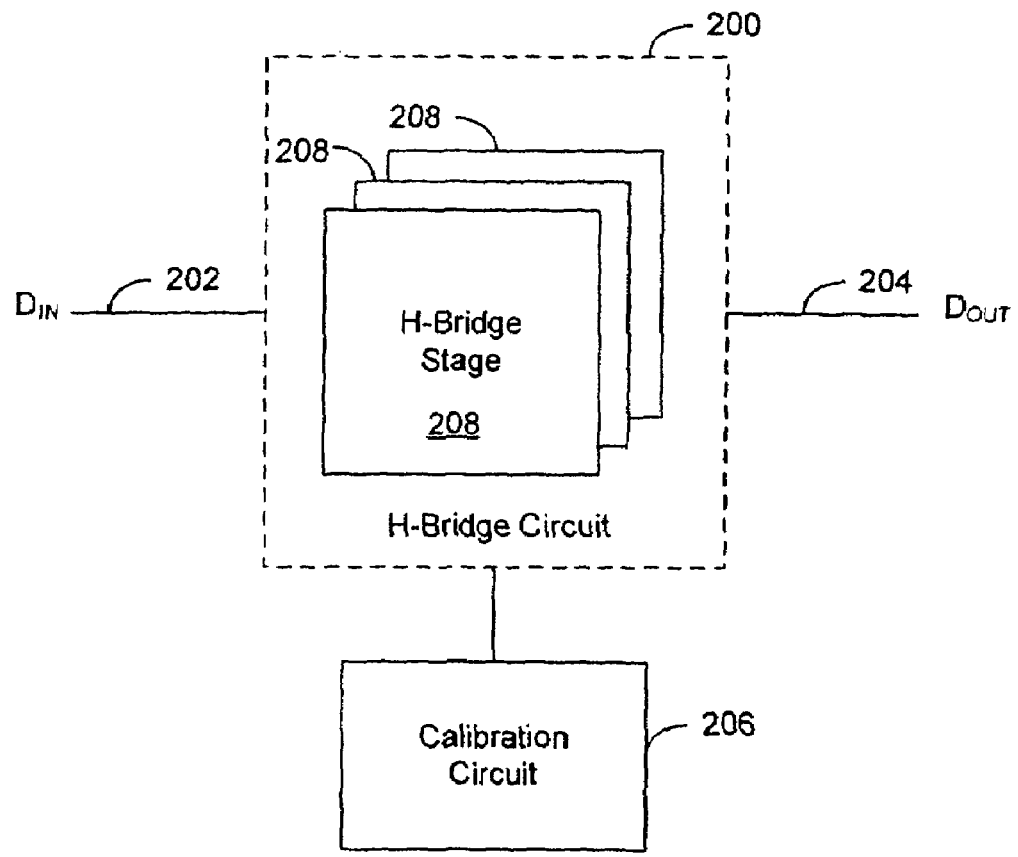
FIG. 2 is a block diagram of a differential driver circuit including an H-bridge circuit and a calibration circuit in accordance with aspects of the invention.

FIG. 2 is a block diagram of a differential driver circuit including a differential driver circuit with an H-bridge circuit 200 and a calibration circuit 206 in accordance with aspects of the invention. The H-bridge circuit 200 receives a data input signal ($D_{IN}$) 202 and generates a data output signal ($D_{OUT}$) 204. The H-bridge circuit 200 is coupled to the calibration circuit 206. The H-bridge circuit 200 includes one or more parallel H-bridge driver stages 208. In most embodiments, the parallel stages 208 collectively form an H-bridge differential driver. In several embodiments, each H-bridge stage includes a p-type stage and an n-type stage. The calibration circuit 206 is configured to determine parameters for calibrating the H-bridge circuit. In several embodiments, the parameters include a first number of p-type stages and a second number of n-type stages to be activated such that the impedance of the parallel driver stages matches a known impedance of a transmission line receiving the differential data output signal $D_{OUT}$.

In one embodiment, the calibration circuit 206 includes a plurality of replica stages arranged in parallel, the replica stages arranged in parallel forming parallel replica stages, where each of the parallel replica stages is a replica of one of the parallel H-bridge driver stages 208. In such case, the calibration circuit can determine an indication of an impedance of the plurality of parallel replica stages using a number of circuit techniques. The calibration circuit can further determine a number of parallel replica stages needed to match the impedance of a transmission line (see FIG. 1) coupled to the differential driver circuit. In one such embodiment, the calibration circuit includes a comparator and a finite state machine configured to increment or decrement the number of parallel replica stages to be activated.

In some embodiments, the calibration circuit further includes one or more precise resistors to provide for impedance determination of the parallel replica stages. The calibration circuit can activate or switch on a number of parallel H-bridge driver stages 208, where the number is equal to the determined number of parallel replica stages. In such case, the impedance of the differential driver can be matched with the impedance of the transmission line.

Figure 3:
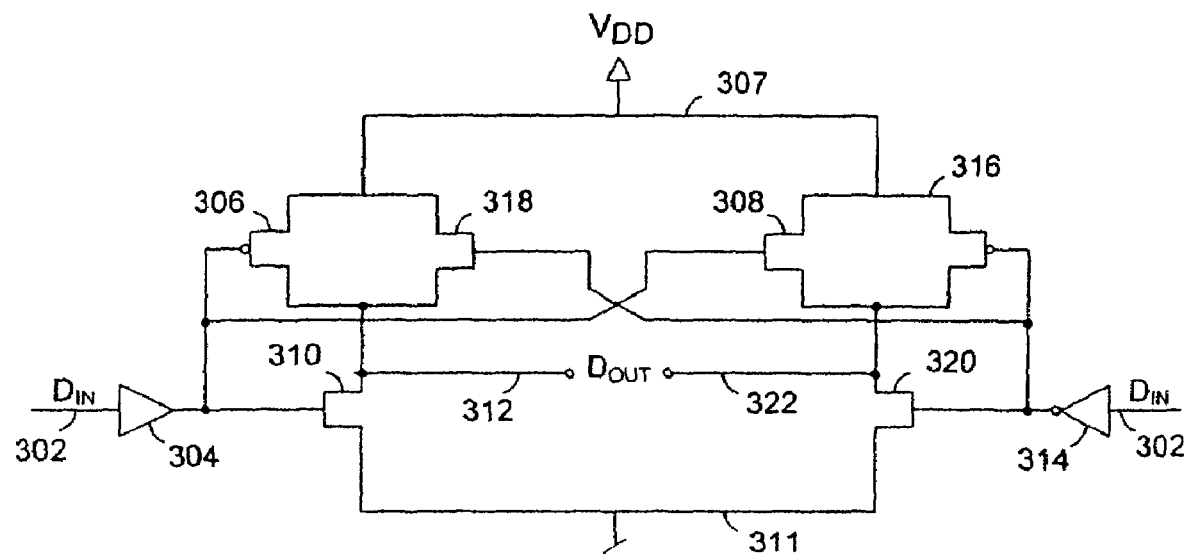
FIG. 3 is a schematic diagram of a differential driver including an H-bridge circuit in accordance with aspects of the invention.

FIG. 3 is a schematic diagram of an embodiment of a differential driver including an H-bridge circuit in accordance with aspects of the invention. In particular embodiments, the H-bridge circuit illustrated in FIG. 3 can represent one H-bridge driver stage as described above for FIG. 2. The H-bridge circuit receives a data input signal ($D_{IN}$) 302 at two locations in the circuit. The data input signal 302 is coupled to a pre-amplifier or pre-driver 304. The output of the pre-amplifier 304 is coupled to a gate of an p-type MOSFET (PMOS transistor) 306. A source of the PMOS transistor 306 is coupled to the common power supply VDD 307 and to a drain of an NMOS transistor 318, which is also coupled to the power supply. In many embodiments the PMOS transistor 306 and the NMOS transistor 318 are coupled to the power supply by one or more resistors, for example to help avoid voltage swings to the limits of the power supply. The drain of PMOS transistor 306 and the source of NMOS transistor 318 are coupled together to a drain of an NMOS transistor 310. The source of NMOS transistor 310 is coupled to the common ground 311. In many embodiments the NMOS transistor 310 is coupled to ground by way of one or more resistors. The drain of NMOS transistor 310 is also coupled to one end 312 of a differential output signal ($D_{OUT}$). The output of the pre-amplifier 304 is also coupled to the gate of NMOS transistor 310 and to a gate of another NMOS transistor 308.

The data input signal 302 is also coupled to an inverting pre-amplifier or pre-driver 314. The output of the inverting pre-amplifier 314 is coupled to the gate of NMOS transistor 318, a gate of another PMOS transistor 316, and a gate of another NMOS transistor 320. The drain of NMOS transistor 308 and the source of PMOS transistor 316 are coupled to VDD 307. As with the PMOS transistor 306 and the NMOS transistor 318, the NMOS transistor 308 and the PMOS transistor 316 may be coupled to power by one or more resistors. The source of NMOS transistor 308 and the drain of PMOS transistor 316 are coupled to the drain of NMOS transistor

320. The source of NMOS transistor 320 is also coupled to a second end 322 of the differential output signal ($D_{OUT}$).

In operation, and in most embodiments, all of the NMOS and PMOS transistors shown in FIG. 3 are switching transistors. For example, when $D_{IN}$ is high, transistors 306, 318 and 320 are turned off, while transistors 308, 316 and 310 are turned on. In such case, differential output signal 312 is driven low (e.g., driven to ground) and differential output signal 322 is driven high (e.g., driven to VDD). When $D_{IN}$ is low, transistors 306, 318 and 320 are turned on, while transistors 308, 316 and 310 are turned off. In such case, differential output signal 312 is driven high and differential output signal 322 is driven low. Thus, in a number of embodiments, the H-bridge circuit receives a single ended data input and generates a corresponding differential output.

In addition, in various embodiments additional transistors and/or resistors may be placed in series and/or in parallel with the discussed circuit elements, for example to provide for appropriate transistor bias or to adjust circuit impedance, drive capability, or other parameters of the circuit, as would generally be known to a person of ordinary skill in the art or a person skilled in the art. Accordingly, it should be recognized that the circuit of FIG. 3 only depicts what may be considered primary components of the circuit.

In several embodiments, the H-bridge circuit does not formally include the pre-amplifiers. In such case, the H-bridge circuit is entirely symmetrical from the data input signals to the data output signals ($D_{OUT}$). Based on the symmetry, the schematic of the H-bridge circuit can be viewed as having two sides split by a logical vertical line, where each side is identical to the other side. In addition, the lower portion (e.g., transistors 310 and 320) can be logically separated as being comprised of only NMOS transistors. In some embodiments, the lower portion can be referred to as an n-type stage. In such case, the upper portion (e.g., transistors 306 and 318) can thus be logically separated as including PMOS transistors. In some embodiments, the upper portion can be referred to as a p-type stage.

In some embodiments, all the transistors are NMOS transistors. In such case, the driver circuit can be particularly well suited to driving low amplitude output signals. In other embodiments, all the upper transistors (306, 318, 308, 316) are PMOS transistors. In such case, the driver circuit can be particularly well suited to driving high amplitude output signals.

In some embodiments, the power supply voltage (VDD) to the H-bridge circuit is equal to a desired differential peak-to-peak output voltage. In one embodiment, the supply voltage provides a voltage signal indicative of a predetermined peak-to-peak output voltage. In a number of embodiments, the supply voltage is provided by an off-chip or external power supply. In one embodiment, the supply voltage is provided at low voltage swings by the off-chip power supply to maximize power efficiency. In another embodiment, the supply voltage is provided, at least in part, by an internal voltage regulator. The use of the internal voltage regulator can be important where a design goal includes a low component count.

Figure 4:
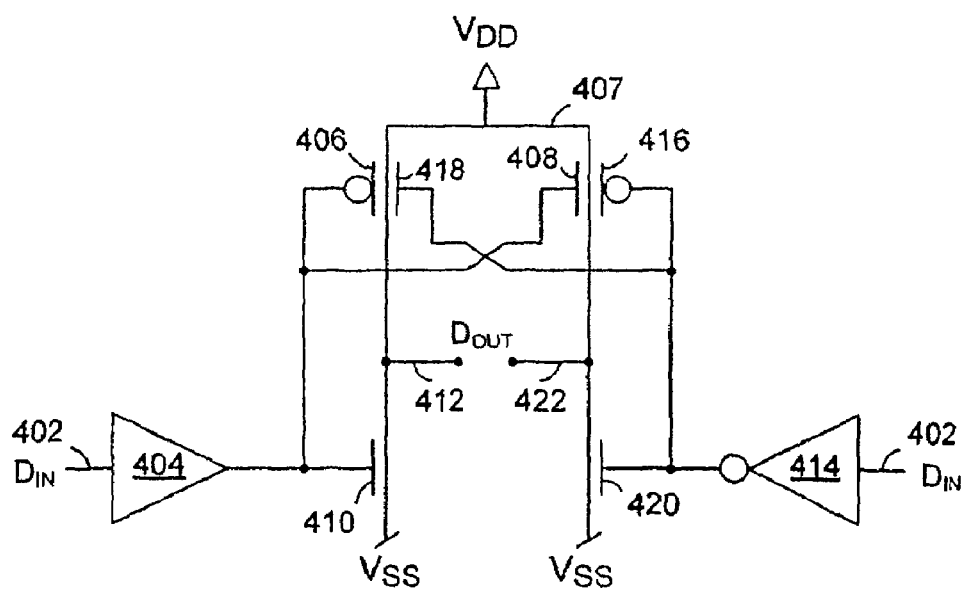
FIG. 4 is an simplified schematic diagram of a differential driver including an H-bridge circuit in accordance with aspects of the invention.

FIG. 4 is a simplified schematic diagram of an H-bridge circuit in accordance with aspects of the invention. In most embodiments, the simplified schematic is equivalent to the H-bridge circuit of FIG. 3. In such embodiments, components 402, 404, 406, 407, 408, 410, 412, 414, 416, 418, 420 and 422 correspond to components 302, 304, 306, 307, 308, 310, 312, 314, 316, 318, 320 and 322, respectively, of FIG. 3. The NMOS and PMOS transistors are depicted in a simplified or shorthand manner to minimize complexity associated with depicting the transistors in an uncollapsed form. As with the circuit of FIG. 3, in various embodiments the circuit of FIG. 4 may include various additional resistors and/or transistors, for example to provide for proper transistor bias or voltage swing headroom, increase of drive capability, impedance adjustment, or adjustment of other circuit parameters.

Figure 5:
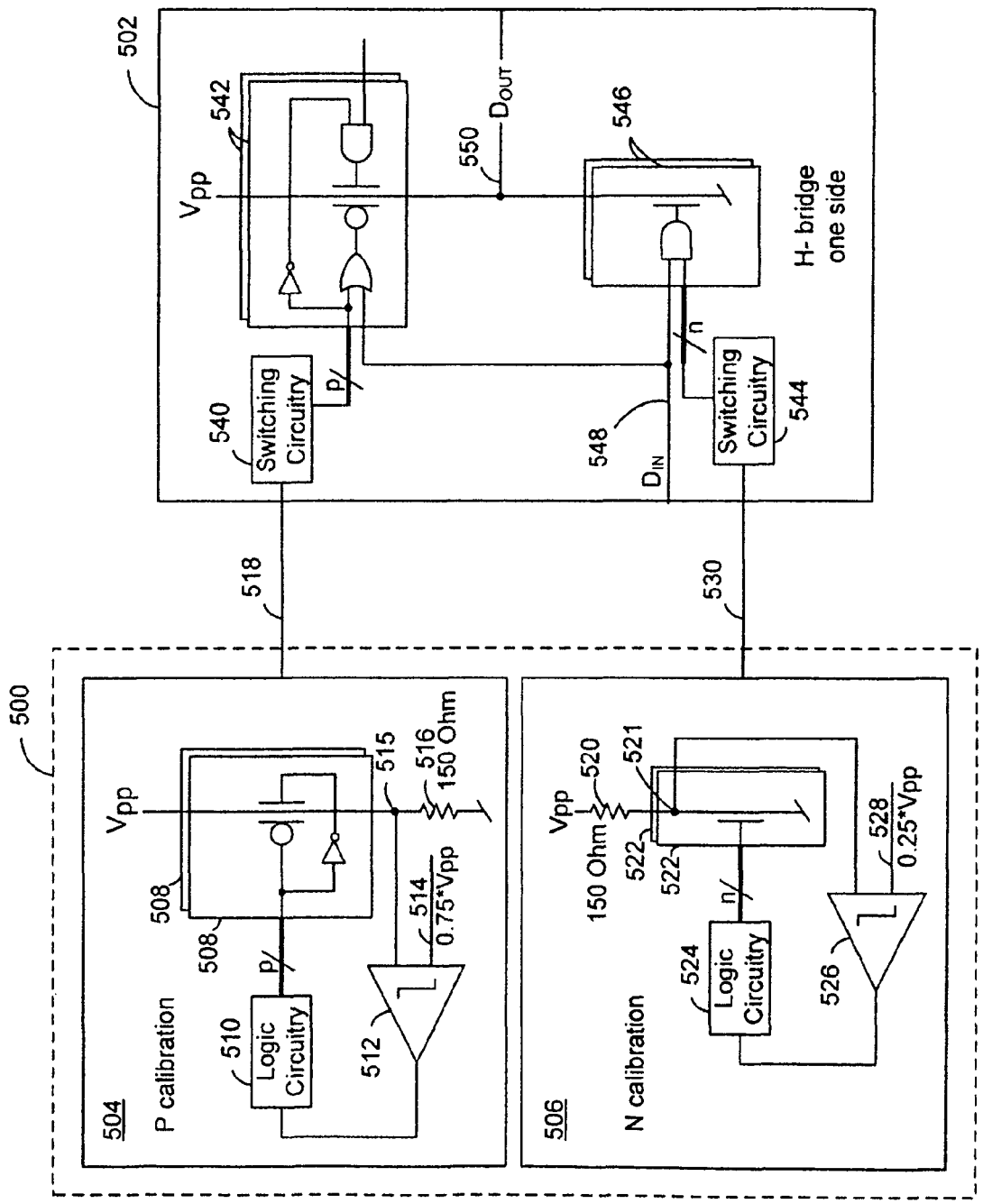
FIG. 5 is a schematic block diagram of a calibration circuit coupled to one side of a H-bridge differential driver circuit in accordance with aspects of the invention.

FIG. 5 is a schematic block diagram of a calibration circuit 500 coupled to one side of differential H-bridge driver circuit 502 in accordance with aspects of the invention. The calibration circuit 500 includes a PMOS calibration circuit 504 for calibrating an impedance of an upper portion of the H-bridge driver circuit and a NMOS calibration circuit 506 for calibrating an impedance of a lower portion of the H-bridge driver circuit.

The PMOS calibration circuit 504 includes a plurality of parallel coupled p-type stages 508 for emulating the upper portions of an H-bridge circuit, logic circuitry 510 for determining a number of parallel p-type stages such that the upper portion of the H-bridge circuit has a predetermined impedance, a comparator 512 for comparing the magnitude of a reference voltage and an operating voltage, and a resistor 516 for providing a precise voltage drop based on a predetermined resistance. In a number of embodiments, the p-type stages 508 are replicas of the upper portion of the H-bridge circuit. In such case, each of the parallel p-type stages can have the same impedance characteristics as the upper portion of the H-bridge circuit, or a stage thereof.

Resistor 516 is coupled to a common ground and coupled at a resistor node 515 to the parallel p-type stages 508. The resistor node 515 is also coupled to one input of the comparator 512. The other input of the comparator 512 is coupled to a reference voltage signal 514. In the illustrated embodiment, the reference voltage signal 514 is equal to a predetermined value of seventy five percent of a common voltage supply (Vpp). In other embodiments, the reference voltage can provide other suitable voltages. The output of the comparator 512 is coupled to the logic circuitry 510. The logic circuitry 510 is coupled to the parallel p-type stages 508. Each p-type stage 508 is coupled to the common voltage supply (Vpp) and the resistor 516.

In operation, the comparator 512 compares the voltage at the resistor node 515 with the reference voltage 514. The voltage at the resistor node 515 is determined by a voltage divider comprised of the resistor 516 and the plurality of parallel p-type stages 508. In the illustrated embodiment, the reference voltage 514 is seventy five percent of Vpp and the resistor has a value of 150 ohms. Therefore, if the impedance of the parallel p-type stages is less than 50 ohms, then the voltage at the resistance node 515 will be greater than seventy five percent of Vpp. In such case, the comparator 512 will generate a signal indicating to the logic circuitry that the impedance should be increased. In response, logic circuitry 510 can decrease the number of active parallel p-type stages to increase the overall impedance of the parallel p-type stages 508.

Similarly, if the impedance of the plurality of p-type stages 508 is greater than 50 ohms, then the voltage at the resistance node 515 will be less than seventy five percent of Vpp. In such case, comparator 512 will generate a signal indicating to logic circuitry 510 that the impedance should be decreased. In response, logic circuitry 510 can increase the number of active parallel p-type stages to decrease the overall impedance of the parallel p-type stages.

Similarly, if the impedance of the plurality of p-type stages 508 is equal to 50 ohms, then the voltage at the resistance node 515 will be equal to seventy five percent of Vpp. In such case, comparator 512 can generate a signal indicating to the logic circuitry that the impedance should be maintained. In response, logic circuitry 510 can maintain the number of active parallel p-type stages.

In most embodiments, logic circuitry 510 determines a number of parallel replica p-type stages (P) to be activated in order to achieve a predetermined impedance. In a number of embodiments, the predetermined impedance is the impedance of a transmission line to be coupled to the output of the H-bridge differential driver. In the illustrated embodiment, the calibration circuit is designed to match a 50 ohm impedance of a transmission line. In most embodiments, the number of parallel replica p-type stages (P) is communicated via one or more signals 518 to the H-bridge circuit. In a number of embodiments, logic circuitry 510 activates or switches a number of parallel p-type stages equal to the number of parallel replica p-type stages (P) using switching circuitry 540 of the driver circuit 502. In some embodiments, reference voltage 514 is generated using a voltage divider including at least two precise resistors having small tolerances.

The NMOS calibration circuit 506 includes a plurality of parallel coupled n-type stages 522 for emulating the lower portions of the H-bridge circuit, logic circuitry 524 for determining a number of parallel n-type stages such that the lower portion of the H-bridge circuit has a predetermined impedance, a comparator 526 for comparing the magnitude of a reference voltage and an operating voltage, and a resistor 520 for providing a precise voltage drop using a predetermined resistance. In a number of embodiments, the n-type stages 522 are replicas of the lower portion of the H-bridge circuit. In such case, the each of the parallel n-type stages can have the same impedance characteristics as the lower portion of the H-bridge circuit, or a stage thereof.

Biasing resistor 520 is coupled to the common power supply (Vpp) and coupled at a resistor node 521 to the plurality of n-type stages 522. The resistor node 521 is also coupled to one input of comparator 526. The other input of comparator 526 is coupled to reference voltage signal 528. In the illustrated embodiment, reference voltage signal 528 is equal to a predetermined value of twenty five percent of Vpp. In other embodiments, reference voltage 528 can provide other suitable voltages. The output of the comparator 526 is coupled to the logic circuitry 524. The logic circuitry 524 is coupled to the plurality of n-type stages 522. Each n-type stage 522 is coupled to the common ground and to resistor 520 at resistor node 521.

In operation, comparator 526 compares the voltage at resistor node 521 with reference voltage 528. The voltage at the resistor node 521 is determined by a voltage divider comprised of the resistor 520 and the plurality of parallel n-type stages 522. In the illustrated embodiment, the reference voltage is twenty five percent of Vpp and the resistor has a value of 150 ohms. Therefore, if the impedance of the parallel n-type stages is less than 50 ohms, then the voltage at the resistance node 521 will be less than twenty five percent of Vpp. In such case, comparator 526 will generate a signal indicating to logic circuitry 524 that the impedance should be increased. In response, logic circuitry 524 can decrease the number of active parallel n-type stages to increase the overall impedance of the parallel n-type stages 522.

Similarly, if the impedance of the plurality of n-type stages 522 is greater than 50 ohms, then the voltage at the resistance node 521 will be greater than twenty five percent of Vpp. In such case, comparator 526 will generate a signal indicating to logic circuitry 524 that the impedance should be decreased. In response, logic circuitry 524 can increase the number of active parallel n-type stages to decrease the overall impedance of the parallel n-type stages 522.

Similarly, if the impedance of the plurality of n-type stages 522 is equal to 50 ohms, then the voltage at the resistance node 521 will be equal to twenty five percent of Vpp. In such case, comparator 526 can generate a signal indicating to logic circuitry 524 that the impedance should be maintained. In response, logic circuitry 524 maintains the number of active parallel n-type stages.

In most embodiments, logic circuitry 524 determines a number of parallel replica n-type stages (N) to be activated in order to achieve a predetermined impedance. In a number of embodiments, the predetermined impedance is the impedance of a transmission line coupled to the output of the H-bridge differential driver. In the illustrated embodiment, the calibration circuit is designed to match the 50 ohm impedance of the transmission line. In most embodiments, the number of parallel replica n-type stages (N) is communicated via one or more signals 530 to the H-bridge circuit. In a number of embodiments, logic circuitry 524 activates or switches a number of parallel n-type stages equal to the number of parallel replica n-type stages (N) using switching circuitry 544 of the driver circuit 502. In some embodiments, reference voltage 528 is generated using a voltage divider including at least two precise resistors having small tolerances.

In some embodiments, logic circuitry 510 and/or logic circuitry 524 are finite state machines that are configured to count up, count down, or hold a steady value based on one or more input signals, where each input signal can be indicative of one of the three possible states. In other embodiments, the logic circuitry can use other forms of circuitry to determine an appropriate number of stages.

The H-bridge side circuit 502 includes logic circuitry 540 coupled to a plurality of parallel p-type H-bridge driver stages 542 and logic circuitry 544 coupled to a plurality of parallel n-type H-bridge driver stages 546. The parallel p-type and n-type driver stages (542, 546) are each coupled to a data input signal ($D_{IN}$) 548 and to one end of a data output signal ($D_{OUT}$) 550. In addition, the parallel p-type H-bridge driver stages 542 are also coupled to the other side of the H-bridge circuit (not shown) and to the common voltage supply (Vpp). The parallel n-type H-bridge driver stages 546 are coupled to the common ground.

In the illustrated embodiment, each p-type H-bridge driver stage 542 includes an inverter, an OR gate, an AND gate, a PMOS transistor and an NMOS transistor. In other embodiments, other logic gates and other configurations can be used. Similarly, in the illustrated embodiment, each n-type H-bridge driver stage 544 includes an AND gate, a PMOS transistor and an NMOS transistor. In other embodiments, other logic gates and other configurations can be used.

In the illustrated embodiment, logic circuitry 540 and logic circuitry 548 are depicted as separate circuits. In a number of embodiments, logic circuitry 540 and logic circuitry 548 are combined to form a single logic circuit.

In operation, considering switching circuitry 540 and 548 as a single circuit, the switching circuitry receives one or more signals indicative of the integer number (P) of parallel p-type driver stages 542 to be enabled in order to match the impedance of the transmission line to be driven by the H-bridge driver circuit. The switching circuitry also receives one or more signals indicative of the integer number (N) of parallel n-type driver stages 546 to be enabled in order to match the impedance of the transmission line to be driven by the H-bridge driver circuit. The switching circuitry activates P p-type driver stages 542 and N n-type driver stages 546. The H-bridge side circuit 502 receives the data input signal ($D_{IN}$) 548 and generates one end 550 of the differential output ($D_{OUT}$). The other end (not shown) of the differential output ($D_{OUT}$) is generated by the other side of the H-bridge side circuit (not shown). In a number of embodiments, the other side of the H-bridge side circuit is a mirror image of the H-bridge side circuit.

Figure 6:
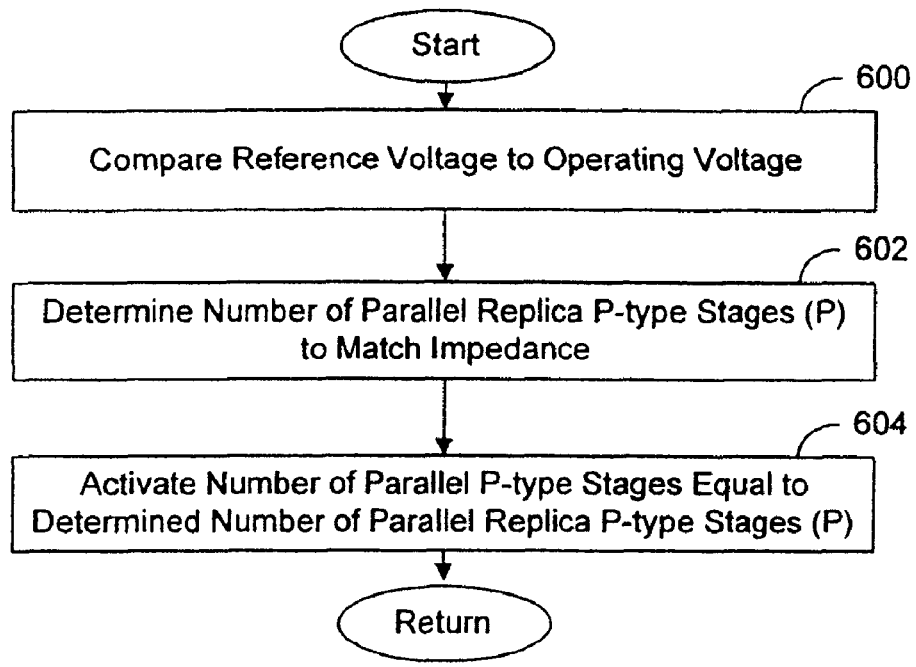
FIG. 6 is a flow diagram of a process for calibrating a portion of an H-bridge circuit in accordance with aspects of the invention.

FIG. 6 is a flow diagram of a process for calibrating a portion of an H-bridge circuit in accordance with aspects of the invention. In particular embodiments, the process is performed by logic circuitry 510 of FIG. 5 to determine calibration parameters for PMOS transistors. In block 600, the process compares a reference voltage to an operating voltage. In most embodiments, the operating voltage is measured at an output node of parallel p-type stages. In a number of embodiments, each parallel p-type stage is a replica of a p-type stage of an H-bridge driver circuit. In many embodiments, the reference voltage is set at a predetermined percentage of the supply voltage to ensure a specific impedance of the parallel p-type stages in the calibration circuit.

In block 602, the process determines an integer number of parallel replica p-type stages to match impedance. In a number of embodiments, the process matches impedance by determining an integer number of parallel replica p-type stages such that the overall impedance of the parallel coupled replica p-type stages approximately matches the impedance of a transmission line coupled to the H-bridge driver circuit. In a number of embodiments, the matching criteria has a tolerance (e.g., up to five percent). In block 604, the process activates a number of parallel p-type stages equal to the determined number of parallel replica p-type stages (P). In a number of embodiments, the process communicates the integer number information to H-bridge driver circuitry.

In one embodiment, the process can perform the illustrated actions in any order. In another embodiment, the process can omit one or more of the actions. In some embodiments, the process performs additional actions in conjunction with the process. In other embodiments, one of more of the actions are performed simultaneously.

Figure 7:
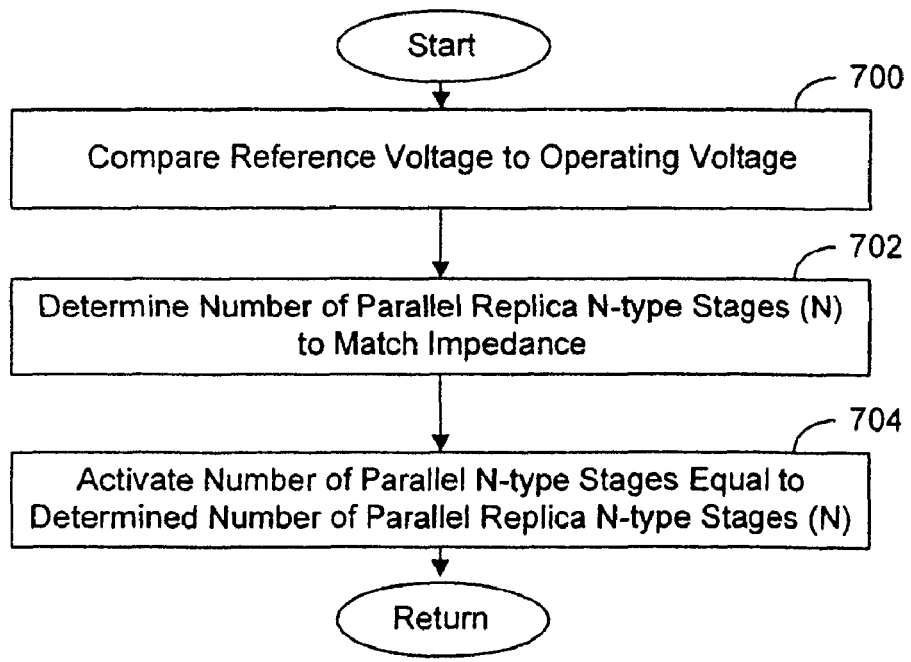
FIG. 7 is a flow diagram of a process for calibrating a portion of an H-bridge circuit in accordance with aspects of the invention.

FIG. 7 is a flow diagram of a process for calibrating a portion of an H-bridge circuit in accordance with aspects of the invention. In particular embodiments, the process is performed by logic circuitry 524 of FIG. 5 to determine calibration parameters for NMOS transistors. In block 700, the process compares a reference voltage to an operating voltage. In most embodiments, the operating voltage is measured at an output node of parallel n-type stages. In a number of embodiments, each parallel n-type stage is a replica of a n-type stage of an H-bridge driver circuit. In many embodiments, the reference voltage is set at a predetermined percentage of the supply voltage to ensure a specific impedance of the parallel n-type stages in the calibration circuit.

In block 702, the process determines an integer number of parallel n-type replica stages to match impedance. In a number of embodiments, the process matches impedance by determining the integer number of parallel n-type replica stages such that the overall impedance of the parallel coupled n-type replica stages approximately matches the impedance of a transmission line coupled to the H-bridge driver circuit. In a number of embodiments, the matching criteria has a tolerance (e.g., up to five percent). In block 704, the process activates a number of parallel n-type stages equal to the determined number of parallel replica n-type stages (N). In a number of embodiments, the process transmits the integer number information to H-bridge driver circuitry.

In one embodiment, the process can perform the illustrated actions in any order. In another embodiment, the process can omit one or more of the actions. In some embodiments, the process performs additional actions in conjunction with the process. In other embodiments, one of more of the actions are performed simultaneously.

Figure 8:
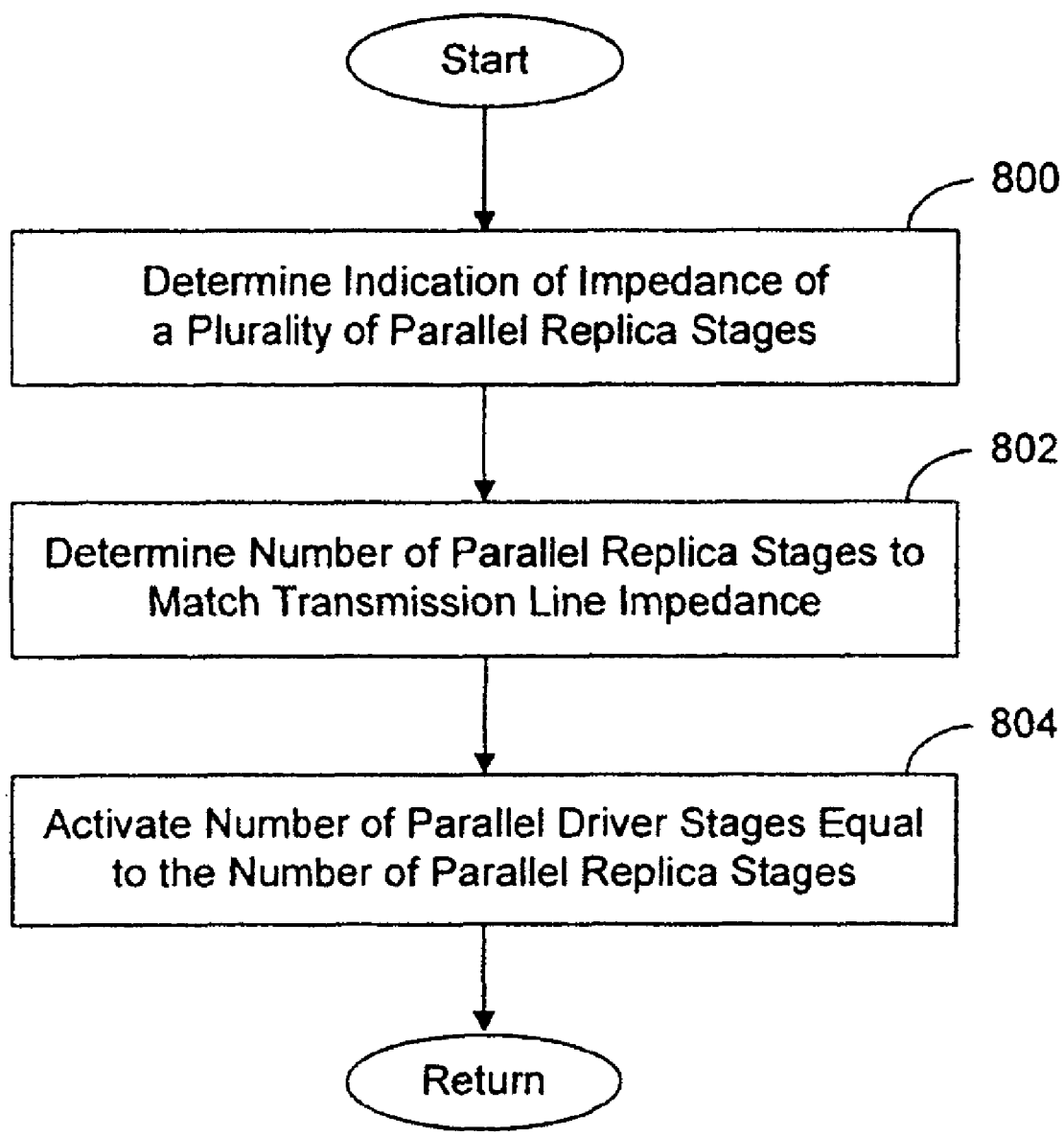
FIG. 8 is a flow diagram of a process for calibrating an H-bridge driver circuit in accordance with aspects of the invention.

FIG. 8 is a flow diagram of a process for calibrating an H-bridge circuit in accordance with aspects of the invention. In particular embodiments, the process is performed by the H-bridge logic circuits (510, 524) of FIG. 5. In some embodiments, the process is performed in conjunction with the switching circuits (540, 548) of FIG. 5. In block 800, the process determines an indication of the impedance of a plurality of parallel replica stages. In one embodiment, the process determines an indication of the impedance of a plurality of p-type parallel replica stages and the impedance of a plurality of n-type parallel replica stages. In block 802, the process determines a number of parallel replica stages to match a transmission line impedance. In one embodiment, the process determines a number of p-type parallel replica stages to match a transmission line impedance. In another embodiment, the process determines a number of n-type parallel replica stages to match a transmission line impedance. In block 804, the process activates a number of parallel driver stages equal to the number of parallel replica stages. In one embodiment, the process activates a number of p-type parallel driver stages equal to the determined number of p-type parallel replica stages. In another embodiment, the process activates a number of n-type parallel driver stages equal to the determined number of n-type parallel replica stages.

In one embodiment, the process can perform the illustrated actions in any order. In another embodiment, the process can omit one or more of the actions. In some embodiments, the process performs additional actions in conjunction with the process. In other embodiments, one of more of the actions are performed simultaneously.

The invention therefore provides a for digital impedance calibration of a differential voltage mode driver. Although the invention has been described with respect to certain embodiments, it should be recognized that the invention may be practiced other than as specifically described, the invention comprising the claims and their insubstantial variations supported by this disclosure.

What is claimed is:

1. A differential driver circuit having at least one driver stage comprising:
   an input coupled by a pre-driver to:
      a gate of a first PMOS transistor in parallel with a first NMOS transistor, where a source of the first PMOS transistor is coupled to a drain of the first NMOS transistor, and a drain of the first PMOS transistor is coupled to a source of the first NMOS transistor;
      a gate of a second NMOS transistor having a drain coupled to the drain of the first PMOS transistor and a source coupled to a ground; and
      a gate of a third NMOS transistor;
   a first differential output coupled to the drain of the second NMOS transistor;
   the input coupled by an inverting pre-driver to:
      a gate of a second PMOS transistor in parallel with the third NMOS transistor, where a source of the second PMOS transistor is coupled to a drain of the third NMOS transistor, and a drain of the second PMOS transistor is coupled to a source of the third NMOS transistor;
      a gate of the first NMOS transistor; and
      a gate of a fourth NMOS transistor having a drain coupled to the drain of the second PMOS transistor and a source coupled to the ground; and a second differential output coupled to the drain of the fourth NMOS transistor;

wherein the source of the first PMOS transistor is coupled to a voltage source;

wherein the source of the second PMOS transistor is coupled to the voltage source; and wherein the voltage source is configured to provide a voltage signal indicative of a predetermined peak to peak output voltage.

2. The differential driver circuit of claim 1, further comprising a plurality of the at least one driver stages coupled in parallel.

3. The differential driver circuit of claim 2, further comprising a calibration circuit configured to activate a number of the plurality of parallel driver stages such that an impedance of the plurality of parallel driver stages approximately matches an impedance of a transmission line coupled to the differential driver.

4. The differential driver circuit of claim 1, wherein the voltage source is an external power supply.

5. The differential driver circuit of claim 1, wherein the voltage source comprises an internal voltage regulator.

6. A method of calibrating a differential driver circuit having a plurality of parallel n-type driver stages and a plurality of parallel p-type driver stages, the differential driver circuit for driving a differential signal over a transmission line having an impedance, the method comprising:

determining an indication of an impedance of a plurality of parallel n-type replica stages, wherein the plurality of parallel n-type replica stages are replicas of the plurality of parallel n-type driver stages;

determining a number of the plurality of parallel n-type replica stages to approximately match the determined indication of impedance of a plurality of parallel n-type replica stages with the transmission line impedance;

activating a number of the plurality of parallel n-type driver stages equal to the number of the plurality of parallel n-type replica stages;

determining an indication of an impedance of a plurality of parallel p-type replica stages, wherein the plurality of parallel p-type replica stages are replicas of the plurality of parallel p-type driver stages;

determining a number of the plurality of parallel p-type replica stages to approximately match the determined indication of impedance of a plurality of parallel p-type replica stages with the transmission line impedance; and activating a number of the plurality of parallel p-type driver stages equal to the number of the plurality of parallel p-type replica stages; and wherein the determining the indication of the impedance of the plurality of parallel n-type replica stages comprises:

measuring a voltage at a node of a first voltage divider comprising the plurality of parallel n-type replica stages in series with a first resistor having a predetermined resistance;

comparing the voltage at the node of the first voltage divider to a first reference voltage having a first predetermined voltage;

wherein the determining the number of the plurality of parallel n-type replica stages to approximately match the measured impedance of a plurality of parallel n-type replica stages with the transmission line impedance comprises:

increasing, decreasing or maintaining the number of the plurality of parallel n-type replica stages based on the comparing the voltage at the node of the first voltage divider to the first reference voltage;

wherein the determining the indication of the impedance of the plurality of parallel p-type replica stages comprises:

measuring a voltage at a node of a second voltage divider comprising the plurality of parallel p-type replica stages in series with a second resistor having the predetermined resistance;

comparing the voltage at the node of the second voltage divider to a second reference voltage having a predetermined voltage; and wherein the determining the number of the plurality of parallel p-type replica stages to approximately match the measured impedance of a plurality of parallel p-type replica stages with the transmission line impedance comprises:

increasing, decreasing or maintaining the number of the plurality of parallel p-type replica stages based on the comparing the voltage at the node of the second voltage divider to the second reference voltage.

7. The method of claim 6: wherein the first and second voltage is dividers are coupled to a voltage source and to a ground;

wherein the first reference voltage is a first percentage of the voltage source;

wherein the second reference voltage is a second percentage of the voltage source;

wherein the first percentage of the voltage source and the predetermined resistance are predetermined such that the comparing the voltage at the node of the first voltage divider to the first reference voltage having a first predetermined voltage reflects a comparison of the impedance of the plurality of the parallel n-type replica stages and the transmission line impedance; and wherein the second percentage of the voltage source and the predetermined resistance are predetermined such that the comparing the voltage at the node of the second voltage divider to the second reference voltage having a second predetermined voltage reflects a comparison of the impedance of the plurality of the parallel p-type replica stages and the transmission line impedance.

8. The method of claim 7, wherein the first reference voltage is about twenty-five percent of the voltage source and the second reference voltage is about seventy-five percent of the voltage source.

9. The method of claim 6, wherein the increasing, decreasing or maintaining, the number of the plurality of parallel n-type replica stages based on the comparing the voltage at the node of the first voltage divider to the first reference voltage is performed by a first finite state machine configured to count up, to count down, or to maintain the number of the plurality of parallel n-type replica stages; and wherein the increasing, decreasing or maintaining the number of the plurality of parallel p-type replica stages based on the comparing the voltage at the node of the second voltage divider and the second reference voltage is performed by a second finite state machine configured to count up, to count down, or to maintain, the number of the plurality of parallel p-type replica stages.

10. The method of claim 6, wherein each p-type driver stage comprises a PMOS transistor in parallel with an NMOS transistor; and wherein each n-type driver stage comprises an NMOS transistor.

11. A circuit for calibrating a differential driver circuit configured to drive a differential signal over a transmission line having an impedance, the circuit comprising:

the differential driver circuit comprising an H-bridge circuit comprising:

a plurality of parallel n-type driver stages coupled to a driver logic circuitry; and
a plurality of parallel p-type driver stages coupled to the driver logic circuitry;
an n-type calibration circuit comprising:
a plurality of parallel n-type replica stages having an impedance, wherein the plurality of parallel n-type replica stages are replicas of the plurality of parallel n-type driver stages;
a first resistor coupled with the plurality of parallel n-type replica stages at a first node;
a first comparator configured to generate a first signal indicative of a comparison of a voltage at the first node with a first reference voltage; and
first logic circuitry coupled to the first comparator and to the plurality of parallel n-type replica stages, the first logic circuitry configured to determine, based on the first comparison signal, a first number (N) of the plurality of parallel n-type replica stages to approximately match the impedance of the plurality of the parallel n-type replica stages and the transmission line impedance; and
wherein the driver logic circuitry is configured to activate N of the plurality of parallel n-type driver stages;
a p-type calibration circuit comprising:
a plurality of parallel p-type replica stages having an impedance, wherein the plurality of parallel p-type replica stages are replicas of the plurality of parallel p-type driver stages;
a second resistor coupled with the plurality of parallel p-type replica stages at a second node;
a second comparator configured to generate a second signal indicative of a comparison of a voltage at the second node with a second reference voltage; and
second logic circuitry coupled to the second comparator and to the plurality of parallel p-type replica stages, the second logic circuitry configured to determine, based on the second comparison signal, a second number (P) of the plurality of parallel p-type replica stages to approximately match the impedance of the plurality of the parallel p-type replica stages and the transmission line impedance; and
wherein the driver logic circuitry is configured to activate P of the plurality of parallel p-type driver stages.

12. The circuit of claim 11,
wherein the differential driver is coupled to a voltage source and to a ground;
wherein the first reference voltage is a first percentage of the voltage source;
wherein the first resistor has a predetermined resistance;
wherein the first percentage of the voltage source and the predetermined resistance are predetermined such that the first signal indicative of a comparison of a voltage at the first node with a first reference voltage reflects a comparison of the impedance of the plurality of the parallel n-type replica stages and the transmission line impedance;
wherein the second reference voltage is a second percentage of the voltage source;
wherein the second resistor has the predetermined resistance; and
wherein the second percentage of the voltage source and the predetermined resistance are predetermined such that the second signal indicative of a comparison of a voltage at the second node with a second reference voltage reflects a comparison of the impedance of the plurality of the parallel p-type replica stages and the transmission line impedance.

13. The circuit of claim 12, wherein the first reference voltage is about twenty-five percent of the voltage source and the second reference voltage is about seventy-five percent of the voltage source.

14. The circuit of claim 11, wherein the first calibration logic circuitry comprises a finite state machine configured to count N up, to count N down, or to hold N constant based on the first signal indicative of a comparison of a voltage at the first node with a first reference voltage; and
wherein the second calibration logic circuitry comprises a finite state machine configured to count P up, to count P down, or to hold P constant based on the second signal indicative of a comparison of a voltage at the second node with a second reference voltage.

15. The circuit of claim 11, wherein each n-type driver stage comprises an NMOS transistor; and
each p-type driver stage comprises a PMOS transistor in parallel with an NMOS transistor.

* * * * *

UNITED STATES PATENT AND TRADEMARK OFFICE
CERTIFICATE OF CORRECTION

PATENT NO. : 7,821,290 B2  
APPLICATION NO. : 12/239418  
DATED : October 26, 2010  
INVENTOR(S) : Bo Bogeskov Thomsen Page 1 of 1

It is certified that error appears in the above-identified patent and that said Letters Patent is hereby corrected as shown below:

On the Title page, column 1, line 2 (Title), delete "CALIBERATION" and insert --CALIBRATION--, therefor.

At column 1, line 2, delete "CALIBERATION" and insert --CALIBRATION--, therefor.

At column 12, line 20, in claim 7, after "voltage" delete "is".

At column 13, line 44, in claim 11, delete "p -type" and insert --p-type--, therefor.

Signed and Sealed this  
Tenth Day of May, 2011

David J. Kappos  
*Director of the United States Patent and Trademark Office*